US010633246B2

(12) United States Patent
Kaija (10) Patent No.: US 10,633,246 B2
(45) Date of Patent: Apr. 28, 2020

(54) REDUCING CROSSTALK IN A MIXED-SIGNAL MULTI-CHIP MEMS DEVICE PACKAGE

(71) Applicant: MURATA MANUFACTURING CO., LTD., Nagaokakyo-shi, Kyoto (JP)

(72) Inventor: Kimmo Kaija, Espoo (FI)

(73) Assignee: MURATA MANUFACTURING CO., LTD., Nagaokakyo-shi, Kyoto (JP)

( * ) Notice: Subject to any disclaimer, the term of this patent is extended or adjusted under 35 U.S.C. 154(b) by 0 days.

(21) Appl. No.: 16/419,453

(22) Filed: May 22, 2019

(65) Prior Publication Data
US 2019/0359480 A1    Nov. 28, 2019

(30) Foreign Application Priority Data

May 22, 2018  (FI) ...................................... 20185469

(51) Int. Cl.
*B81B 7/00* (2006.01)
*H04B 1/16* (2006.01)
(52) U.S. Cl.
CPC ............ *B81B 7/0006* (2013.01); *H04B 1/16* (2013.01); *B81B 2207/012* (2013.01); *B81B 2207/07* (2013.01); *B81B 2207/098* (2013.01)
(58) Field of Classification Search
CPC ....... B81B 7/00; B81B 7/0006; B81B 7/0022; B81B 7/0032; B81B 7/0064; B81B 7/007; B81B 2207/012; B81B 2207/07; B81B 2207/098; H04B 1/16; H04B 3/00; H04B 3/02; H04B 3/32; H04B 3/34
See application file for complete search history.

(56) References Cited

U.S. PATENT DOCUMENTS

| 5,511,428 A * | 4/1996 | Goldberg | .............. B81B 7/0061 |
| | | | 257/417 |
| 6,538,336 B1 * | 3/2003 | Secker | .................... H01L 23/50 |
| | | | 257/786 |
| 7,064,442 B1 * | 6/2006 | Lane | ..................... H01L 23/495 |
| | | | 257/676 |

(Continued)

OTHER PUBLICATIONS

Finnish Search Report dated Dec. 5, 2018 corresponding to Finnish Patent Application No. 20185469.

(Continued)

*Primary Examiner* — James M Perez
(74) *Attorney, Agent, or Firm* — Squire Patton Boggs (US) LLP (57) ABSTRACT

A mixed-signal multi-chip package comprises a lead frame, a first die, and a digital die. The first die can provide an analog signal in an analog chip pad of the first die. The digital die can receive the analog signal from the first die through an analog chip pad. The analog input chip pad is coupled with the respective analog output chip pad of the first die by a first bonding wire. The digital die is configured to communicate with external circuitry using a digital signal-bearing signal exchanged via at least one first bond pad of the lead-frame. A second bond pad of the lead frame configured to be coupled to a DC voltage extends laterally along a plane of the lead-frame between the first bond pad and the first bonding wire, to form a DC guard between the first bond pad and the first bonding wire.

14 Claims, 4 Drawing Sheets

(56) References Cited

U.S. PATENT DOCUMENTS

| | | | | |
|---|---|---|---|---|
| 7,569,472 B2* | 8/2009 | Ali | | H01L 23/49838 257/E21.508 |
| 8,217,474 B2* | 7/2012 | Lee | | B81C 1/00246 257/254 |
| 8,618,620 B2* | 12/2013 | Winkler | | G01L 9/0054 257/415 |
| 8,787,539 B2* | 7/2014 | Marchetti | | H04B 3/02 370/352 |
| 8,921,955 B1* | 12/2014 | Lee | | B81B 7/0061 257/416 |
| 9,704,847 B2* | 7/2017 | Nakaiso | | H01L 27/0805 |
| 2005/0087856 A1* | 4/2005 | Joiner | | H01L 23/50 257/690 |
| 2005/0205951 A1* | 9/2005 | Eskridge | | B81B 7/007 257/416 |
| 2006/0267167 A1* | 11/2006 | McCain | | G06K 19/0702 257/678 |
| 2007/0212903 A1* | 9/2007 | Punzalan | | H01L 23/3107 439/70 |
| 2007/0262836 A1* | 11/2007 | Voss | | H01P 3/081 333/247 |
| 2009/0218668 A1* | 9/2009 | Zhe | | B81C 1/00301 257/680 |
| 2009/0278245 A1* | 11/2009 | Bonifield | | H01L 23/481 257/676 |
| 2010/0193923 A1* | 8/2010 | Tanaka | | B81B 7/007 257/676 |
| 2012/0040468 A1* | 2/2012 | Khaled | | A61B 5/14532 436/95 |
| 2012/0274141 A1* | 11/2012 | Shibahara | | H01G 5/18 307/75 |
| 2013/0154071 A1* | 6/2013 | Haigh | | H01L 23/49503 257/676 |
| 2014/0159217 A1* | 6/2014 | Kim | | H01L 23/49562 257/676 |
| 2016/0225602 A1* | 8/2016 | Ristroph | | H01J 49/009 |
| 2016/0307854 A1* | 10/2016 | Matsubara | | H01L 23/49503 |
| 2018/0241382 A1* | 8/2018 | Wang | | H04L 25/00 |
| 2019/0112185 A1* | 4/2019 | Mantyoja | | B81C 1/00825 |
| 2019/0113412 A1* | 4/2019 | Stoicescu | | H01L 24/49 |
| 2019/0157227 A1* | 5/2019 | Fillion | | H01L 24/82 |
| 2019/0157233 A1* | 5/2019 | Fillion | | H01L 24/06 |
| 2019/0177159 A1* | 6/2019 | Kaija | | H01L 23/49555 |

OTHER PUBLICATIONS

Oct. 22, 2019 Search Report issued in European Patent Application No. 19174590.

* cited by examiner

REDUCING CROSSTALK IN A
MIXED-SIGNAL MULTI-CHIP MEMS
DEVICE PACKAGE

FIELD

The present invention relates to a method and an apparatus to crosstalk protection. More particularly, the present invention relates to crosstalk protection in an electronic component package comprising at least one microelectromechanical sensor.

BACKGROUND

Micro-Electro-Mechanical Systems, in short MEMS can be defined as miniaturized mechanical and electro-mechanical systems where at least some elements have a mechanical functionality. Since MEMS devices are created with the same or similar tools used to create integrated circuits, micromachines and microelectronics can be fabricated on the same piece of silicon.

MEMS structures can be applied to quickly and accurately detect very small changes in physical properties. For example, a microelectronic gyroscope can be applied to quickly and accurately detect very small angular displacements.

Detection of movement of the movable parts of a MEMS structure may be for example capacitive or piezoelectric. In either case, electrical signals obtained from a moving MEMS structure comprise relatively weak analog signals, and any electrical or magnetic interference may cause errors in these sensitive analog signals, thus deteriorating the performance of the MEMS device. An example of such weak and sensitive analog signals is a sense signal corresponding to movement of at least one part of the MEMS structure.

A mixed-signal multi-chip package refers to a single package comprising at least two integrated circuit (IC) dies, also referred to as chips, wherein both analog and digital signals are processed by the IC dies within the same package. An exemplary mixed-signal multi-chip package may comprise an analog IC die and a digital IC die or a mixed-signal IC die and a digital IC die.

The sensitive analog signals from a MEMS structure are preferably digitized as close to the point of generation as practically possible. One solution is to dispose a MEMS chip comprising the MEMS structure and some front-end analog circuitry into an IC component package body together with an integrated circuit (IC) capable of digitizing analog signals and further processing the digitized signals. This way the distance required for coupling the analog signals for further processing may be minimized. The IC may be for example an application specific integrated circuit (ASIC). However, integration of analog and digital IC's in a single mixed-signal multi-chip package may also introduce problems through coexistence of both sensitive analog signals and relatively strong digital signals. Crosstalk between strong digital signals and sensitive analog signals is one of these problems.

Figure 1:
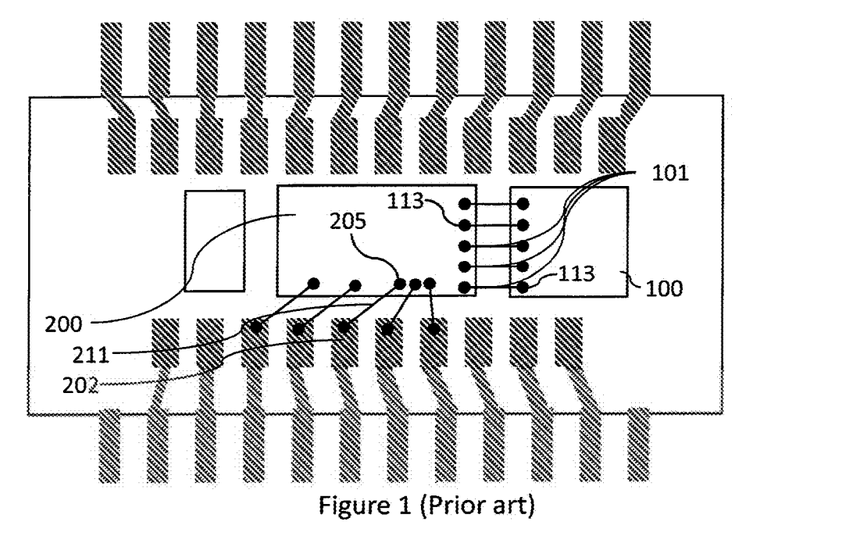
FIG. 1 illustrates a conventional mixed-signal multi-chip component.

FIG. 1 illustrates a conventional mixed-signal multi-chip component. Sensitive analog signals are carried between the MEMS die (100) and a digital IC die (200) over first bonding wires (101). The first bonding wires (101) are coupled to the dies (100, 200) at first chip pads (113). Digital signals are communicated from the digital IC die (200) towards outside circuitry via leads of a lead-frame, which is marked in the FIG. 1 with diagonal striped fill. At least one digital signal is coupled from a second chip pad (205) to a bond pad of the lead-frame by second bonding wires (211). The bond pad is electrically connected to a lead configured to communicate with circuitry external of the mixed-signal multi-chip component using the at least one digital signal. We may call such bond pad carrying a digital signal as a signal-bearing bond pad (202). Crosstalk may easily occur between a signal-bearing bond pad (202) and a first bonding wire (101) within the volume of the component body, since there is no electromagnetic interference (EMI) protection between the two. If crosstalk causes erroneous values in the sensitive analog signals, the digital processing may not be able correct the erroneous results but assumes the voltage or current caused by crosstalk as being originally provided by the MEMS die (100). Thus, the digital signal does not represent properly the wanted signal comprising information received from the MEMS die (100), but it may be a sum of the wanted analog signal and crosstalk error. Thus, crosstalk reduces accuracy and reliability of detection results achieved with the MEMS device, which detection results are obtained by analysing the sensitive analog signals provided by the MEMS die (100) and carried by the first bonding wires (101). A sensitive analog signal carried by one of the first bonding wires (101) may be referred to as a victim or as a victim signal, whereas the disturbing digital signal carried through the second bonding wire (211) may be referred to as an aggressor and the signal-bearing bond pad (202) may also be referred to as an aggressor bond pad. Likewise, the respective bonding wires may be referred to as a victim bonding wire (101) and an aggressor bonding wire (211).

Figure 2:
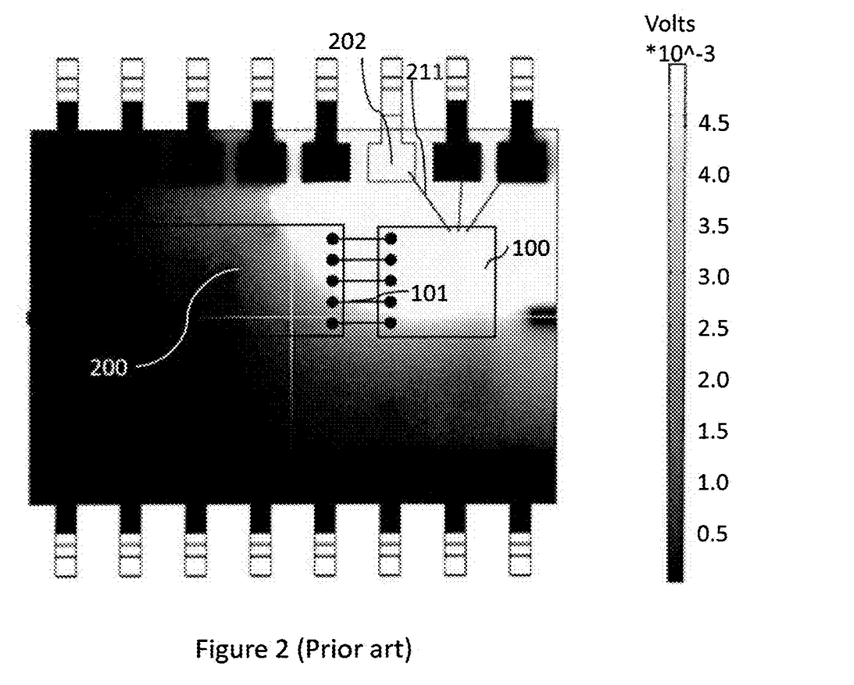
FIG. 2 illustrates electromagnetic interference in a conventional mixed-signal multi-chip component.

FIG. 2 is a capture from a simulation that further illustrates the problem in the prior art. Electric potential caused by an aggressor bond pad (202) is illustrated with shades of grey. The whiter the area, the stronger is the voltage caused by the aggressor. In the black area the electric potential caused by the aggressor is not significant. While the victim bonding wires (101) carrying sensitive analog detection signals are all within the area at which the electric potential caused by the aggressor is high, risk of errors caused by crosstalk is significant. In this simulation, an exemplary test voltage of 1V was used in the aggressor bond pad (202). The resulting voltage caused by the aggressor bond pad at the area of the closest victim bonding wires (101) was found to be in the level of 5 mV. As understood by a skilled person, the actual amount of crosstalk and thus the error caused by the crosstalk at the victim bonding wires (101) depends on the nature and level of the aggressor and victim signals as well as various structural aspects of the design, but the simulation provides a good basis level for comparison.

DESCRIPTION OF THE RELATED ART

Several solutions for reducing crosstalk between signals communicated to outside of the component package are known in the art.

U.S. Pat. No. 6,538,336 discloses a semiconductor device assembly facilitating high-speed communication between an integrated circuit die and external circuitry. Signal-bearing bond pads are separated from one another by bond wires at fixed voltage levels.

U.S. Pat. No. 7,569,472 solves a problem of minimizing crosstalk between adjacent signal wires by introducing a power ring.

However, these solutions do not consider nor cover the problem of crosstalk between a digital signal-bearing bond pad carrying the digital signal to outside and a sensitive signal communicated internally within the multi-chip module between two dies over bonding wires.

A solution is thus needed which reduces crosstalk between victim and aggressor signals communicated within a mixed-signal multi-chip MEMS package.

SUMMARY

An object is to provide a method and apparatus so as to solve the problem of crosstalk between digital and sensitive analog signals in a mixed-signal multi-chip package. The objects of the present invention are achieved with a mixed-signal multi-chip package according to the claim 1. The objects of the present invention are further achieved with a method according to the claim 8.

The preferred embodiments of the invention are disclosed in the dependent claims.

The present invention is based on the idea of utilizing a combination of relative placement of the sensitive signals within the multi-chip component and the potentially disturbing outward signals, relative placements of bonding sites for outward signals as well as optimizing layout and size of the bonding sites for outward signals for reducing crosstalk between sensitive analog signals within the multi-chip design and digital signals communicated towards external circuitry.

According to a first aspect, a mixed-signal multi-chip package is provided comprising a lead frame, a first die and a digital die. The lead frame comprises a die handle. The first die attached to the die handle comprises MEMS structures and configured to provide at least one analog signal in at least one analog chip pad of the first die. The digital die attached to the die handle is configured to receive the at least one analog signal from the first die through at least one analog chip pad of the digital die, wherein a first bonding wire couples the at least one analog chip pad of the digital die with the respective at least one analog output chip pad of the first die. The at least one digital die is configured to communicate with external circuitry using at least one digital signal-bearing signal exchanged via at least one first bond pad of the lead-frame. At least one second bond pad of the lead frame configured to be coupled to a DC voltage extends laterally along a plane of the lead-frame between the at least one first bond pad and the first bonding wire, to form a DC guard between the at least one first bond pad and the first bonding wire.

According to a second aspect, the area of the at least first bond pad is less than 50% of the area of a median sized bond pad of the lead-frame.

According to a third aspect, the at least one second bond pad is disposed adjacent to the at least one first bond pad at the side of the at least one first bond pad that is towards the first bonding wire.

According to a fourth aspect, the at least one second bond pad covers a section of the circumference of the at least one first bond pad in the direction of the first wire bonding that is greater than a section of the circumference covered by an average size bond pad.

According to a fifth aspect, the DC voltage is any one of a ground voltage and an operating voltage.

According to a sixth aspect, the lead-frame comprises two second bond pads bridged by a bridging part of the lead frame with one another, wherein the at least one first bond pad resides between the two second bond pads, wherein the two second bond pads are short-circuited by the bridging part, wherein the bridging part encircles the at least one first bond pad at the side opposite of at least one signal-bearing lead configured to couple the respective at least one first bond pad towards external circuitry, and wherein the bridging part is configured to form an DC barrier between the at least one first bond pad and other of parts residing inside the mixed-signal multi-chip package.

According to a seventh aspect, the bridging part is extended to further encircle a lateral area comprising the signal-bearing chip pads and the signal-bearing bonding wires coupling the at least one first bond pad and the signal-bearing chip pads.

According to a first method aspect, a method for reducing crosstalk in a mixed-signal multi-chip package is provided comprising a lead frame comprising a die handle, the method comprising carrying at least one analog signal between at least one analog chip pad of a first die attached to the die handle, the first die comprising MEMS structures and at least one analog chip pad of at least one digital die attached to the die handle, wherein each of the at least one analog signal is carried between the respective analog chip pads by a first bonding wire, processing the at least one analog signal by circuitry of the digital die and communicating by the circuitry of the digital die with external circuitry using at least one digital signal-bearing signal exchanged via at least one first bond pad of a lead-frame. The method comprises coupling at least one second bond pad disposed between the at least one first bond pad and the first bonding wire to a DC voltage, wherein the at least one second bond pad extends laterally along a plane of the lead-frame to form a DC guard between the at least one first bond pad and the first bonding wire.

According to a second method aspect, the method further comprises reducing area of the at least first bond pad so that the area of the at least first bond pad is less than 50% of the area of a median sized bond pad of the lead-frame.

According to a third method aspect, the method further comprises disposing the at least one second bond pad adjacent to the at least one first bond pad at the side of the at least one first bond pad that is towards the first bonding wire.

According to a fifth method aspect, the method further comprises covering with the at least one second bond pad a section of the circumference of the at least one first bond pad in the direction of the first wire bonding that is greater than a section of the circumference covered by an average size bond pad.

According to a sixth method aspect, the DC voltage is any one of a ground voltage and an operating voltage.

According to a seventh method aspect, the method further comprises bridging, by a bridging part of the lead-frame, two second bond pads with one another, so that the at least one first bond pad resides between the two second bond pads. The two second bond pads are short-circuited by the bridging part. The bridging part encircles the at least one first bond pad at the side opposite of at least one signal-bearing lead configured to couple the respective at least one first bond pad towards external circuitry. The bridging part is configured to form an DC barrier between the at least one first bond pad and other of parts residing inside the mixed-signal multi-chip package.

According to an eighth method aspect, the method further comprises extending the bridging part to further encircle a lateral area of the package that comprises the signal-bearing chip pads and the signal-bearing bonding wires coupling the at least one first bond pad and the signal-bearing chip pads.

The present invention has the advantage that the layout of the lead-frame may be optimized for minimized crosstalk with no additional cost, as long as the digital circuit layout allows the digital signal-bearing signals to be coupled to the lead-frame in a position that is away from the points of coupling the sensitive analog signals between the analog and digital dies.

BRIEF DESCRIPTION OF THE DRAWINGS

In the following the invention will be described in greater detail, in connection with preferred embodiments, with reference to the attached drawings, in which.

DETAILED DESCRIPTION

FIGS. 1 to 7 show a top view of a multi-chip package, and dimensions along the illustrated plane (xy-plane) of this view may be referred to as the lateral dimensions.

Figure 3:
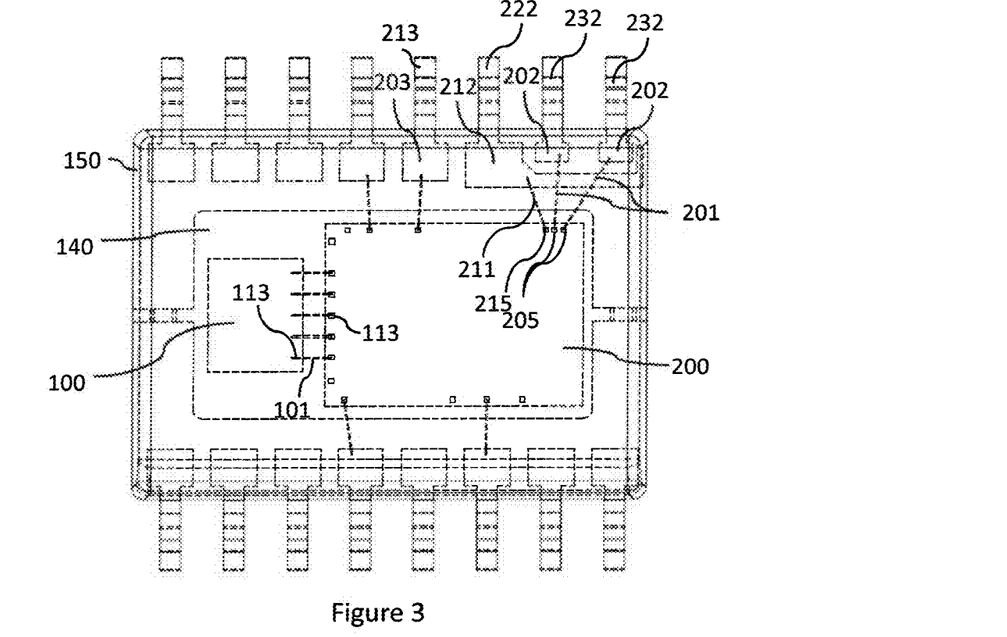
FIG. 3 illustrates an exemplary layout of a lead-frame according to a first embodiment.

The FIG. 3 shows an exemplary layout of a lead-frame of a multi-chip package with two dies according to a first embodiment. A MEMS die 100 comprises the electromechanical parts, which include moving elements, as well as analog circuitry configured at least to provide analog signals at chip pads (113) of the MEMS die (100). The chip pads (113) of the MEMS die (100) comprise at least analog output chip pads. The digital die (200) may be for example an application specific integrated circuit (ASIC) configured to receive analog signals from the MEMS die (100) over multiple first bonding wires 101 at the chip pads (113). The chip pads (113) of the digital die (200) comprise at least analog input chip pads. We may call the first bonding wires as the analog bonding wires (101), since they are used for carrying analog signals. Typically, analog signals received from a MEMS die (100) have relatively low current and/or voltage and are therefore sensitive to any electromagnetic interference. In this example, the analog signals carried by the first bonding wires (101) may be referred to as victims, since quality of these signals may suffer if exposed to any electromagnetic interference such as crosstalk.

The MEMS die (100) and the digital die (200) may be attached to a die handle (140) for example by gluing. The die handle (140), which is part of the lead-frame, forms a mechanically rigid support for the dies (100, 200). In a typical integrated circuit, the lateral area of the die handle (140) exceeds that of the dies (100, 200) attached to it.

The MEMS die (100) and the digital die (200) are preferably designed and placed to facilitate short analog bonding wires (101) between the MEMS die (100) and the digital die (200). The analog bonding wires (101) attach to respective chip pads (113) of the MEMS die (100) and the digital die (200). Preferably, the chip pads 113 of the MEMS die (100) for coupling the analog bonding wires (101) are arranged along one side of the MEMS die (100) and the chip pads (113) of the digital die (200) for coupling the analog bonding wires (101) are arranged along one side of the digital die (200) so that the orders of the chip pads (113) on the two dies correspond to each other so that the parallel analog bonding wires (101) form a row. Short analog bonding wires (101) contribute to improvement of the quality of sensitive analog signals communicated over the analog bonding wires (101) and reduce risk for unwanted electrical interference caused for example by crosstalk. Any wire bonding technology known in the art may be applied for the bonding the dies to each other and/or to the lead-frame.

The digital die (200) communicates with external circuitry using digital signal-bearing signals. These digital signal-bearing signals are coupled from chip pads (205) of the digital die (200) by second bonding wires (201) to a plurality of bond pads (202) on the lead-frame of the multi-chip package. As these second bonding wires carry digital signal-bearing signals, we may call these signal-bearing bonding wires, and the respective chip pads (205) may be called signal-bearing chip pads. Likewise, the respective bond pads may be called signal-bearing bond pads (202). Ground and supply voltage signals for the digital die (200) are likewise connected between chip pads of the digital die (200) and a bond pad (212) of the lead-frame by bonding wires. We may call the chip pads, bond pads and the bonding wires configured to carry the ground and supply voltage signals as DC chip pads (215), DC bonding wires (211) and DC bond pads (212). The signal-bearing bond pads (202) and the one or more DC bond pads (212) form part of a lead-frame of the component package, which comprises the bond pads and leads extending from the bond pads. Signal-bearing leads (232) are coupled to the signal-bearing bond pads (202) and DC leads (222) are coupled to the DC bond pads (212). Figures also show further bond pads (203) coupled to leads (213). These further bond pads (203) are shown as standard size reference bond pads. The further bond pads (203) may carry any signals. The chip pads (205, 215) are not all marked with reference signs in FIG. 2 for clarity but may be recognized in the FIG. 3 as small rectangular areas into which the thin bonding wires (101, 201, 211) are coupled to.

In a typical lead-frame structure the bond pads (202, 203, 212) form a plane. The die paddle (140) may reside in the same plane with the bond pads, or it may form another plane parallel with the plane of the bond pads. Bond pads (202, 203, 212) and die paddle (140) are disposed within the package body (150), while leads (213, 222, 232) extend outside the package body, facilitating coupling of the package for example to a printed circuit board (PCB).

With reference to the FIG. 3, a first aspect to notice is the relative placement of the signal-bearing chip pads, signal-bearing second bonding wires (201) and the signal-bearing bond pads (212). The signal-bearing chip pads (205) of the digital IC die are disposed in a location that is removed from the analog bonding wires (101). In the disclosed example, the signal-bearing chip pads are disposed essentially at or at least near a corner of the digital die (200), which corner is away from the analog bonding wires (101). If the multi-chip package had leads on all four sides, the signal-bearing chip pads could also be disposed along the side of the digital IC die (200) which is opposite to that of the chip pads (113) configured to carry the sensitive analog signals. The signals from the signal-bearing chip pads (205) are wire bonded to signal-bearing bond pads (202), which are located close to the signal-bearing chip pads to enable using short bonding wires (211). The signal-bearing bond pads (201) should also be disposed in a position on the lead-frame that is removed from the analog bonding wires (101). The mere distance between the possibly interfering digital signal-bearing elements facilitates reducing of crosstalk. Also, short bonding wires reduce risk of crosstalk. This applies to all bonding wires, especially those carrying analog or digital signals.

A second aspect is the size and design of the signal-bearing bond pads (202). The area of the signal-bearing bond pads (202) should be reduced or minimized. Minimizing refers to reducing the area as much as conveniently possible without compromising the capability to reliably attach of the bonding wire to the bond pad or compromising mechanical robustness of the lead-frame. In this example, the major part of the signal-bearing bond pads (202) comprises the area required for facilitating coupling the signal-bearing bond pad (202) towards the respective signal-bearing lead (232), but the area on the bond pads (202) reserved for attaching the bonding wire is preferably minimized, taking into account the design rules for the used bonding technology, component package requirements and lead-frame design requirements, which may set minimum allowed values for example for spacing between adjacent bond pads and width and length of bond pads for ensuring reliable bonding. For example, the area of the signal-bearing bond pads (202) may be less than 50% of the area of other, "normal" or "median" bond pads (203). The area of the signal-bearing bond pads (202) may be less than 50% of the area of a median sized bond pad (203) of the lead-frame. However, depending on the lead-frame design requirements, it is not necessary to reduce the area of the signal-bearing bond pads (202) from that of a normal, median sized bond pad, or the area of the signal-bearing bond pads (202) may be reduced less than 50% from the area of median bond pads.

A third aspect is the location and the design of DC bond pads (212) and that of the respective DC chip pads (215). A DC bond pad (212) is disposed next to a signal-bearing bond pad (202) within area that is approximately between the signal-bearing bond pads (202) and the analog bonding wires (101). The DC chip pad (215) is preferably located near to the respective DC bond pad (212) and also in the immediate vicinity of the respective signal-bearing bond pad (205). Mere placement of the DC bond pad (212) facilitates reducing of crosstalk from the signal-bearing bond pads (202) towards the analog bonding wires (101). This effect can further be improved by designing the layout of the DC bond pad (212). Especially the DC bond pad (212) which is adjacent to the signal-bearing bond pad (202) has been extended within the component package along a plane of the lead-frame so that it at least partially encircles the at least one signal-bearing bond pad (202), particularly at the side of the signal-bearing bond pad that resides towards the semiconductor dies. Partially encircling refers to a relative position of the DC bond pad (212) and the signal-bearing bond pad (202) in which the DC bond pad comprises an oblong part, for example a segment of an annulus, that covers a sector of circumference of the signal-bearing bond pad (202) that is greater than a sector covered by an average size bond pad disposed in the same location. As shown in the figures, the oblong part may be non-circular, i.e. it may have bends. Preferably the sector covered by the extended DC bond pad (212) resides in the direction of the victim bonding wire when looking from the aggressor, signal-bearing bond pad (202). The extended DC bond pad (212) thus forms a DC guard between the at least signal-bearing bond pad and the analog bonding wires (101). A DC guard can be characterized as a kind of guard trace between an aggressor and a victim such that a magnetic field created by the aggressor meets the DC guard so that a current induced by the magnetic field flows in the DC guard rather than in the victim. A DC signal, such as ground or an operating voltage is less sensitive to slight changes caused by such induced current. A special case of a DC guard is a ground guard, when the DC voltage is equal to the ground. However, other DC voltages such as an operating voltage may be used in a DC guard. Also, the area of the extended DC bond pad (212) along the plane of the lead-frame is preferably greater than the area of a median sized "normal" or "average" bond pad (203). The extended DC bond pad (212) may carry ground or operating voltage, which are both DC signals that may be considered as electrical ground terminal in view of the digital signal-bearing signals carried through the signal-bearing bond pads (202). The extended layout of the DC bond pad (212) effectively forms a ground barrier between the possible interfering aggressor digital signal and the possible victim analog signals carried by the analog bonding wires (101).

Figure 4:
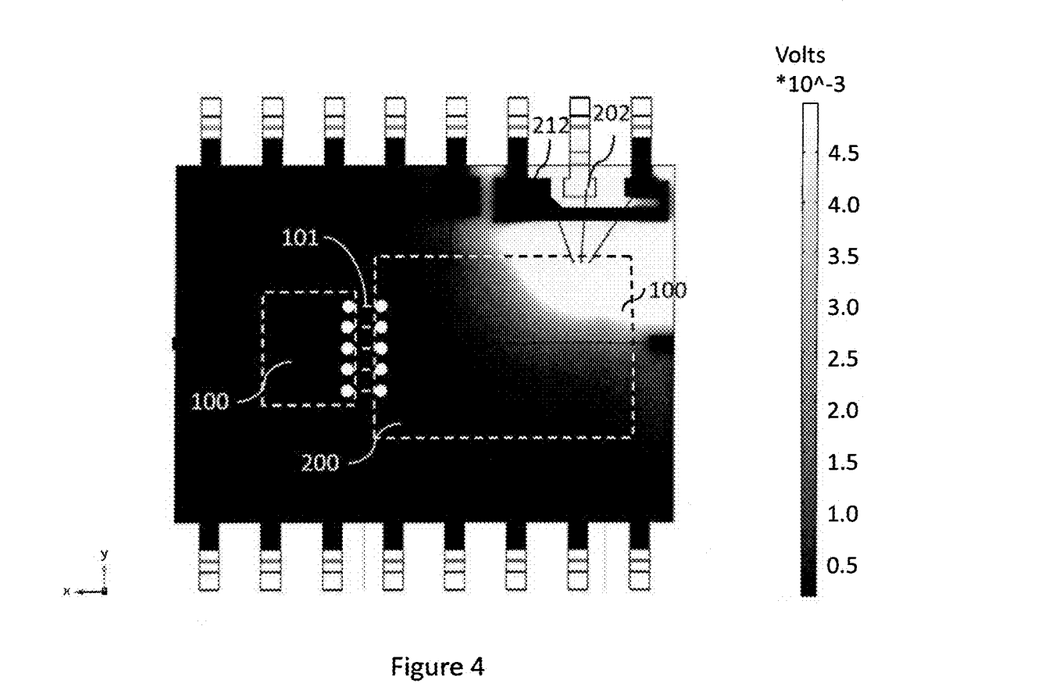
FIG. 4 illustrates electromagnetic interference in the first embodiment.

FIG. 4 illustrates a simulation result of electromagnetic interference effects caused by one signal-bearing bond pad (202) along the lead-frame in the first embodiment of the FIG. 3. Similar to the simulation plot of a prior art design shown in the FIG. 2, white areas illustrate stronger electric potential caused by the signal-bearing bond pad (202) that represents an aggressor, while the black areas illustrate those areas in which the electric potential caused by the aggressor is low and risk of crosstalk is therefore significantly lower. As a result of the combination of placement of the signal-bearing chip pads and bond pads away from the analog bonding wires (101) and placement and shaping of the aggressor signal-bearing bond pad (202) and placement and shaping of the DC bond pad (212) next to the aggressor signal-bearing bond pad (202), the possibly interference or crosstalk causing voltage generated by the aggressor bond pad in the area of the analog bonding wires (101) is clearly reduced, and the risk and amount of crosstalk towards the sensitive analog bonding wires (101) is therefore significantly reduced. In the illustrated simulation an exemplary test voltage of 1V was used in the aggressor bond pad, and the resulting voltage level caused by the aggressor in the area of the victim bonding wires (101) is in the level of 0-0.5 mV, in other words, less than 10% of that of the reference layout shown in the FIGS. 1 and 2. Thus, with the same aggressor signal, the risk and level of error in the victim bonding wires (101) is to less than 10%. In other words, if the signals and signal levels in the circuitries of the simulation of FIG. 2 and FIG. 4 were alike, as well as the lengths of the victim bonding wires (101), the level of crosstalk error in the signal in the multi-chip package design according to the first embodiment would also be reduced to less than 10% of that of the exemplary prior art multi-chip package design.

Figure 5:
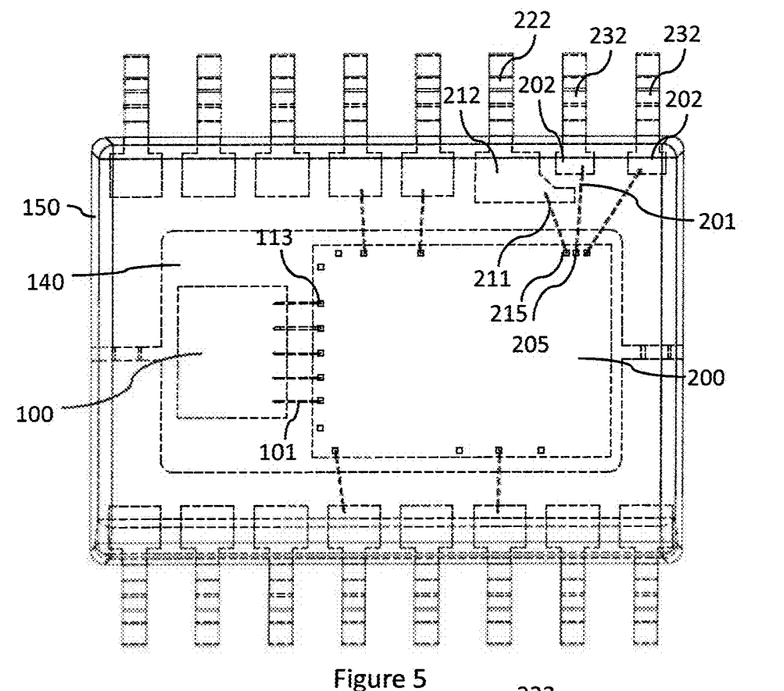
FIG. 5 illustrates a second embodiment.
Figure 6:
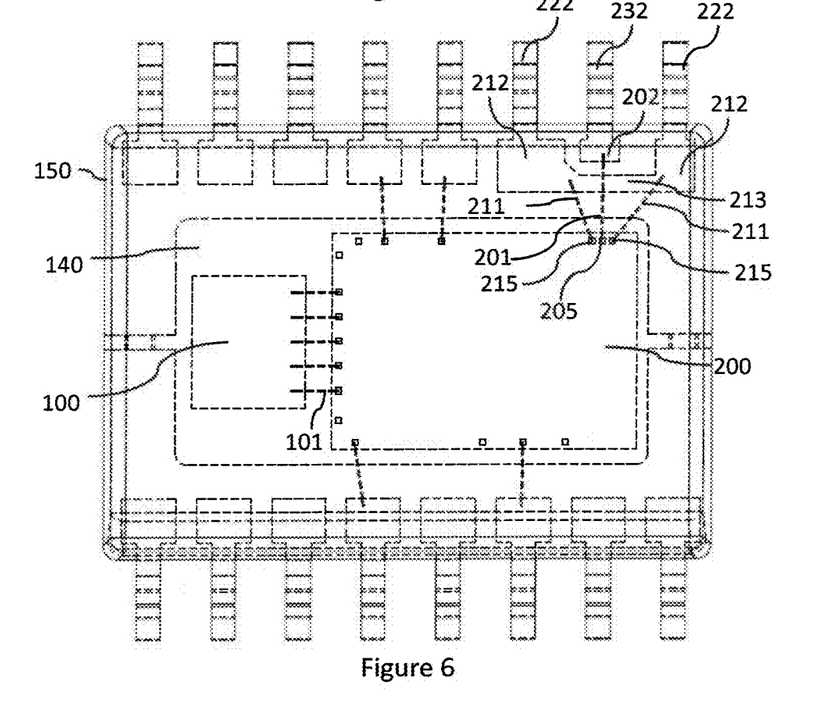
FIG. 6 illustrates a third embodiment.
Figure 7:
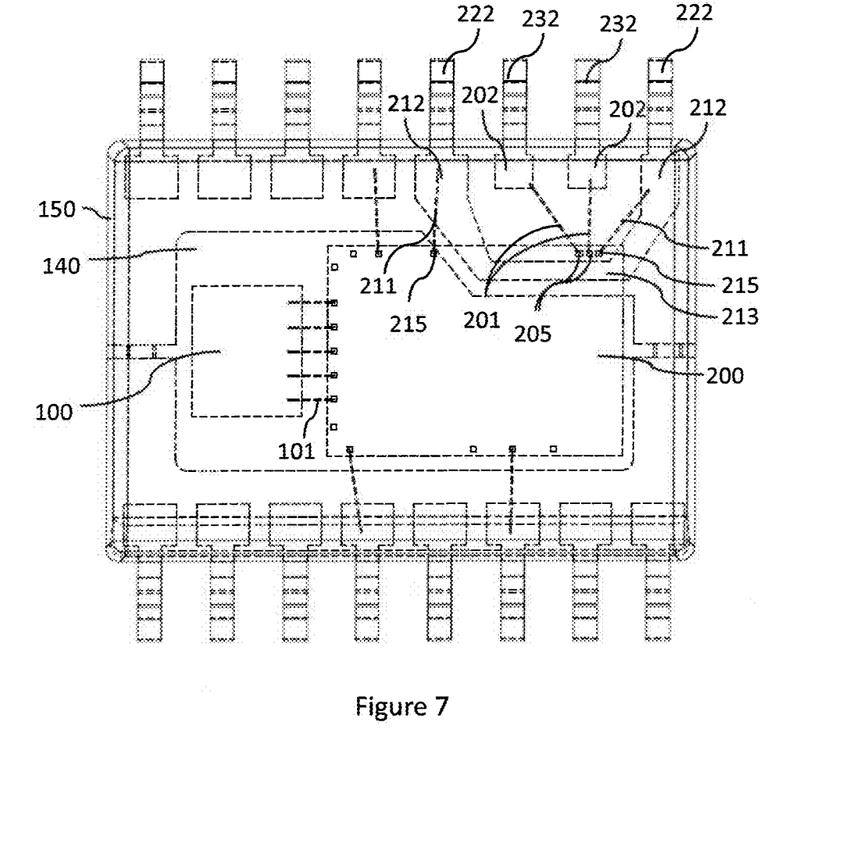
FIG. 7 illustrates a fourth embodiment.

FIGS. 5, 6 and 7 illustrate further embodiments of the invention with alternative shapes of one or more extended DC bond pads (212).

In the second embodiment illustrated in the FIG. 5, area of the DC bond pad (212) disposed next to the signal-bearing (aggressor) bond pad (202) is again bigger than any other bond pad in the lead-frame, and especially clearly bigger than that of the signal-bearing bond pads (212). The DC bond pad (212) is slightly extended so that the extension creates a DC guard between the aggressor and the possible victims. The cross-coupling protection caused by the extended DC bond pad (212) of the second embodiment is not as strong as in the first embodiment shown in the FIG. 3, but the combined effect of relative placement of the DC bond pad (212) and the signal-bearing bond pads (202), small area of the signal-bearing bond pads (212) and maximized distance between the signal-bearing bonding wires (201) and bond pads (202) and the sensitive analog signal carrying bonding wires (101) may still provide sufficient level of protection from crosstalk.

FIG. 6 illustrates a third embodiment, in which the extended DC bond pad formed from the lead-frame is further extended along a plane of the lead-frame, so that it forms a bridging part (213). The bridging part (213) essentially encircles a signal-bearing bond pad (202) along a plane of the lead-frame at the side of the dies, in other words on the side opposite to the signal-bearing lead (232). This bridging part (213) bridges and short-circuits two extended DC bond pads (212), which may both be coupled to DC chip pads (215) with DC bonding wires (211). The bridging part (213) and the DC chip pads (215) preferably cover a sector of the circumference of the signal-bearing bond pad (202) that covers at least the half of the circumference of the signal-bearing bond pad (202) that resides opposite to the signal-bearing lead (232). The bridging part thus forms part of an annulus-like form in the plain of the lead-frame inside the component package, which form covers the sector between the two DC bond pads (212) short-circuited by the bridging part that resides opposite to the signal-bearing lead (232). The bringing part thus effectively creates a DC barrier between the signal-bearing bond pad (202) and the rest of the package, so that the DC barrier resides on the side of the signal-bearing bond pad (202) that is away from the signal-bearing lead (232). When coupled to ground potential, the DC barrier may also be called ground barrier. However, the DC barrier may also be coupled to another steady DC voltage, such as an operating voltage.

FIG. 7 illustrates a fourth embodiment, in which a bridging part (213) formed from the lead-frame around a plurality of signal-bearing bond pads 202. Similar to the embodiment of the FIG. 6, this bridging part forms a DC barrier that short-circuits two DC bond pads (212), which may both be coupled to DC chip pads (215) with DC bonding wires (211). In this embodiment, the bridging part (213) partially extends below the digital IC die (200), so that also the area in which the signal-bearing chip pads (205) are disposed resides on the side of the DC barrier that lies towards the signal-bearing leads (232), and so that the signal-bearing chip pads (205) are disposed at different side of the DC barrier than the possible victim bonding wires 101. In order to enable the DC barrier to extend laterally into the area of the digital IC die (200), the die handle (140) area has been reduced by removing one part of the die handle (140), thus leaving room for extending the bridging part (213).

As understood by a skilled person, the configurations of FIGS. 6 and 7 assumes that the two DC chip pads (215) short-circuited with each other shall be coupled to the same DC potential via the respective leads (222). Any number of signal-bearing bond pads (202) may be disposed behind the DC barrier formed by the bridging part (213) of embodiments of FIGS. 6 and 7. It is apparent to a person skilled in the art that as technology advanced, the basic idea of the invention can be implemented in various ways. The invention and its embodiments are therefore not restricted to the above examples, but they may vary within the scope of the claims.

The invention claimed is:

1. A mixed-signal multi-chip package, comprising:
    a lead frame comprising a die handle,
    a first die attached to the die handle and comprising MEMS structures and configured to provide at least one analog signal in at least one analog chip pad of the first die, and
    a digital die attached to the die handle and configured to receive the at least one analog signal from the first die through at least one analog chip pad of the digital die, wherein a first bonding wire couples the at least one analog chip pad of the digital die with the respective at least one analog output chip pad of the first die,
    wherein the at least one digital die is configured to communicate with external circuitry using at least one digital signal-bearing signal exchanged via at least one first bond pad of the lead-frame,
    and wherein
    at least one second bond pad of the lead frame configured to be coupled to a DC voltage extends laterally along a plane of the lead-frame between the at least one first bond pad and the first bonding wire, to form a DC guard between the at least one first bond pad and the first bonding wire.

2. The mixed-signal multi-chip package of claim 1, wherein the area of the at least first bond pad is less than 50% of the area of a median sized bond pad of the lead-frame.

3. The mixed-signal multi-chip package of claim 1, wherein the at least one second bond pad is disposed adjacent to the at least one first bond pad at the side of the at least one first bond pad that is towards the first bonding wire.

4. The mixed-signal multi-chip package of claim 1, wherein
    the at least one second bond pad covers a section of the circumference of the at least one first bond pad in the direction of the first wire bonding that is greater than a section of the circumference covered by an average size bond pad.

5. The mixed-signal multi-chip package of claim 1, wherein the DC voltage is any one of a ground voltage and an operating voltage.

6. The mixed-signal multi-chip package of claim 1, wherein the lead-frame comprises two second bond pads bridged by a bridging part of the lead frame with one another, wherein the at least one first bond pad resides between the two second bond pads, wherein the two second bond pads are short-circuited by the bridging part, wherein the bridging part encircles the at least one first bond pad at the side opposite of at least one signal-bearing lead configured to couple the respective at least one first bond pad towards external circuitry, and wherein the bridging part is configured to form an DC barrier between the at least one first bond pad and other of parts residing inside the mixed-signal multi-chip package.

7. The mixed-signal multi-chip package of claim 6, wherein the bridging part is extended to further encircle a lateral area comprising the signal-bearing chip pads and the signal-bearing bonding wires coupling the at least one first bond pad and the signal-bearing chip pads.

8. A method for reducing crosstalk in a mixed-signal multi-chip package comprising a lead frame comprising a die handle, the method comprising:
    carrying at least one analog signal between at least one analog chip pad of a first die attached to the die handle and comprising MEMS structures and at least one analog chip pad of at least one digital die attached to the die handle, wherein each of the at least one analog signal is carried between the respective analog chip pads by a first bonding wire;
    processing the at least one analog signal by circuitry of the digital die; and communicating by the circuitry of the digital die with external circuitry using at least one digital signal-bearing signal exchanged via at least one first bond pad of a lead-frame; and coupling at least one second bond pad disposed between the at least one first bond pad and the first bonding wire to a DC voltage, wherein the at least one second bond pad extends laterally along a plane of the lead-frame to form a DC guard between the at least one first bond pad and the first bonding wire.

9. The method of claim 8, wherein the method further comprises reducing area of the at least first bond pad so that the area of the at least first bond pad is less than 50% of the area of a median sized bond pad of the lead-frame.

10. The method of claim 8, wherein the method further comprises disposing the at least one second bond pad adjacent to the at least one first bond pad at the side of the at least one first bond pad that is towards the first bonding wire.

11. The method of claim 8, further comprising:
covering with the at least one second bond pad a section of the circumference of the at least one first bond pad in the direction of the first wire bonding that is greater than a section of the circumference covered by an average size bond pad.

12. The method of claim 8, wherein the DC voltage is any one of a ground voltage and an operating voltage.

13. The method of claim 8, further comprising:
bridging, by a bridging part of the lead-frame, two second bond pads with one another, so that the at least one first bond pad resides between the two second bond pads, wherein the two second bond pads are short-circuited by the bridging part, wherein the bridging part encircles the at least one first bond pad at the side opposite of at least one signal-bearing lead configured to couple the respective at least one first bond pad towards external circuitry, and wherein the bridging part is configured to form an DC barrier between the at least one first bond pad and other of parts residing inside the mixed-signal multi-chip package.

14. The method of claim 13, wherein the method further comprises:
extending the bridging part to further encircle a lateral area of the package that comprises the signal-bearing chip pads and the signal-bearing bonding wires coupling the at least one first bond pad and the signal-bearing chip pads.

* * * * *